(12) United States Patent
Rogers

(10) Patent No.: US 12,256,484 B2
(45) Date of Patent: *Mar. 18, 2025

(54) FREQUENCY CHIRP RESONANT OPTIMAL PLASMA IGNITION METHOD

(71) Applicant: Atmospheric Plasma Solutions, Inc., Cary, NC (US)

(72) Inventor: Terrence E. Rogers, Durham, NC (US)

(73) Assignee: Atmospheric Plasma Solutions, Inc., Cary, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/504,063

(22) Filed: Oct. 18, 2021

(65) Prior Publication Data

US 2023/0009209 A1  Jan. 12, 2023

Related U.S. Application Data

(63) Continuation of application No. 17/085,694, filed on Oct. 30, 2020, now Pat. No. 11,153,961, which is a
(Continued)

(51) Int. Cl.
*H05H 1/46* (2006.01)
*H05H 1/24* (2006.01)

(52) U.S. Cl.
CPC ............... *H05H 1/46* (2013.01); *H05H 1/24* (2013.01); *H05H 1/463* (2021.05); *H05H 2240/10* (2013.01); *H05H 2245/40* (2021.05)

(58) Field of Classification Search
None
See application file for complete search history.

(56) References Cited

U.S. PATENT DOCUMENTS 3,987,339 A   10/1976   Wroblewski
4,414,491 A   11/1983   Elliott
(Continued)

FOREIGN PATENT DOCUMENTS

WO    99/55125 A1    10/1999
WO    2020214764 A1  10/2020

OTHER PUBLICATIONS

International Search Report and Written Opinion issued Jul. 17, 2020 by the ISA/US for related application PCTUS2028434 (13 pages).
(Continued)

*Primary Examiner* — Srinivas Sathiraju
(74) *Attorney, Agent, or Firm* — Olive Law Group, PLLC

(57) ABSTRACT

A system for plasma ignition and maintenance of an atmospheric pressure plasma. The system has a variable frequency alternating current (AC) power source, a transformer, a cable connected to a secondary winding of the transformer, a programmed microprocessor for control of power to the atmospheric pressure plasma. The microprocessor is configured to a) at pre-ignition, power the AC power source at an operational frequency $f_{op}$ higher than the resonant frequency $f_r$, b) decrease the operational frequency $f_{op}$ of the AC power source until there is plasma ignition, and c) after the plasma ignition, further decrease the operational frequency $f_{op}$ of the AC power source to a frequency lower than the resonant frequency $f_r$.

20 Claims, 15 Drawing Sheets

Related U.S. Application Data continuation of application No. PCT/US2020/028434, filed on Apr. 16, 2020.

(60) Provisional application No. 62/834,947, filed on Apr. 16, 2019, provisional application No. 62/834,545, filed on Apr. 16, 2019.

(56) References Cited

U.S. PATENT DOCUMENTS

| | | | |
|---|---|---|---|
| 4,560,908 | A | 12/1985 | Stupp et al. |
| 4,701,671 | A | 10/1987 | Stupp et al. |
| 5,041,763 | A | 8/1991 | Sullivan et al. |
| 5,636,111 | A | 6/1997 | Griffin et al. |
| 5,930,126 | A | 7/1999 | Griffin et al. |
| 6,034,485 | A | 3/2000 | Parra |
| 6,088,249 | A | 7/2000 | Adamson |
| 6,181,066 | B1 | 1/2001 | Adamson |
| 6,300,722 | B1 | 10/2001 | Parra |
| 6,323,603 | B1 | 11/2001 | Persson |
| 6,353,294 | B1 | 3/2002 | Wammes et al. |
| 6,404,089 | B1 | 6/2002 | Tomion |
| 6,522,082 | B1 | 2/2003 | Wammes et al. |
| 6,969,957 | B2 | 11/2005 | Ellams |
| 7,298,091 | B2 | 11/2007 | Pickard et al. |
| 8,502,455 | B2 | 8/2013 | Kanda |
| 8,575,843 | B2 | 11/2013 | Moore et al. |
| 9,475,710 | B2 * | 10/2016 | Shannon .................. C02F 1/72 |
| 9,537,422 | B2 | 1/2017 | Kawato |
| 9,570,273 | B2 | 2/2017 | Watson et al. |
| 9,656,095 | B2 | 5/2017 | Watson et al. |
| 10,039,927 | B2 | 8/2018 | Watson et al. |
| 10,064,263 | B2 | 8/2018 | Watson et al. |
| 10,187,968 | B2 | 1/2019 | Buchanan et al. |
| 10,237,962 | B2 | 3/2019 | Thompson et al. |
| 11,019,713 | B2 * | 5/2021 | Yancey .................... H01F 38/10 |
| 11,019,714 | B1 * | 5/2021 | Rogers .................... H01F 27/385 |
| 11,153,961 | B2 * | 10/2021 | Rogers .............. H01J 37/32935 |
| 2004/0150190 | A1 | 8/2004 | Gonzalez et al. |
| 2004/0160190 | A1 | 8/2004 | Gonzalez et al. |
| 2005/0134192 | A1 | 6/2005 | Ellams |
| 2007/0138976 | A1 | 6/2007 | Noda |
| 2010/0300620 | A1 | 12/2010 | Kanda |
| 2011/0234102 | A1 * | 9/2011 | Kim ........................ H05H 1/46 <br> 315/111.21 |
| 2014/0262789 | A1 * | 9/2014 | Shannon .................... C02F 1/46 <br> 204/554 |
| 2016/0066405 | A1 | 3/2016 | Habu |
| 2016/0278197 | A1 | 9/2016 | Kamata |
| 2017/0156200 | A1 | 6/2017 | Watson et al. |
| 2017/0232122 | A1 | 8/2017 | Hancock |
| 2018/0271582 | A1 | 9/2018 | Canady et al. |
| 2019/0008027 | A1 | 1/2019 | Weilguni et al. |
| 2021/0051790 | A1 * | 2/2021 | Yancey .................. H05B 41/16 |
| 2021/0051793 | A1 * | 2/2021 | Rogers .............. H01J 37/32944 |
| 2021/0274629 | A1 * | 9/2021 | Yancey .................... H05H 1/30 |
| 2021/0274630 | A1 * | 9/2021 | Rogers ................ H03M 1/1245 |
| 2023/0009209 | A1 * | 1/2023 | Rogers .............. H01J 37/32917 |

OTHER PUBLICATIONS

Supplemental European Search Report dated Jan. 24, 2023 received from European Patent Office (1 page).

Examiner's Report dated Jan. 20, 2023 received from Canadian Intellectual Property Office for related Canadian Patent Application No. 3,136,812.

Extended European Search Report dated Jan. 4, 2023 received from European Patent Office.

* cited by examiner

FREQUENCY CHIRP RESONANT OPTIMAL PLASMA IGNITION METHOD

CROSS REFERENCE TO RELATED APPLICATIONS

This application is a continuation of and claims priority to U.S. Ser. No. 17/085,694 filed Oct. 30, 2021, the entire contents of which are incorporated herein by reference, entitled "Frequency Chirp Resonant Optimal Ignition Method", which is related to and claims priority to PCT/US20/28434 filed Apr. 16, 2020, the entire contents of which are incorporated herein by reference, entitled "Frequency Chirp Resonant Optimal Ignition Method," which is related to and claims priority to U.S. Ser. No. 62/834,947 filed Apr. 16, 2019, entitled "Waveform Detection of States and Faults in Plasma Inverters," the entire contents of which are incorporated herein by reference. This application is related to U.S. Ser. No. 62/834,119 filed Apr. 15, 2019, entitled "Asymmetrical Ballast Transformer," the entire contents of which are incorporated herein by reference. This application is related to and claims priority to U.S. Ser. No. 62/834,545 filed Apr. 16, 2019, entitled "Frequency Chirp Resonant Optimal Ignition Method," the entire contents of which are incorporated herein by reference.

BACKGROUND OF THE INVENTION

Field of Invention

The invention relates to ways to ignite atmospheric pressure plasmas.

Discussion of the Background

Plasmas have been used extensively in a wide variety of industrial and high technology applications including, for example, semiconductor fabrication, various surface modifications, and coatings of reflective films for window panels and compact disks. Plasmas ranging in pressure from high vacuum (<0.1 mTorr) to several Torr are common and have been used for film deposition, reactive ion etching, sputtering and various other forms of surface modifications. For example, gas plasmas are known for the treatment of plastics and molded substrates (e.g., thermoplastic olefin substrates used as bumpers and fascia in the automotive industry) to improve adhesion of subsequently applied coating layers. The modification typically is a few molecular layers deep, thus bulk properties of the polymeric substrate are unaffected. A primary advantage of using plasma for such purposes is that it results in an "all dry" process that generates little or no effluent, does not require hazardous conditions such as high pressures, and is applicable to a variety of vacuum-compatible materials, including, inter alia, silicon, metals, glass and ceramics.

It is commonly known to use plasma, typically 02 plasmas, as a means of removing hydrocarbon and other organic surface contaminants from various substrates. However, because of the short lifetime of these reactants and their line-of-sight reactivity on the surface, these highly activated reactants are not especially well-suited for surface cleaning of irregular surfaces, unpolished or roughened metallic surfaces, or surfaces having a three-dimensional topography.

Also, use of plasma at reduced pressures has several disadvantages in that the substrate to be treated or cleaned must be placed under vacuum and must be capable of surviving under such reduced pressure conditions. Use of a plasma at or above atmospheric pressure avoids these drawbacks.

Yet, the coupling of power into and ignition of atmospheric pressure plasmas is not straight forward, especially during the time frame when the gas transitions into a plasma. The gas presents a high impedance to the power source, while the resultant plasma appears as a low impedance load to the power source, with the transition from these states resulting in a dynamic change in impedance and current surges, which can stress power supplies resulting in equipment failure.

SUMMARY

In one embodiment of the invention, there is provided a system for plasma ignition and maintenance of an atmospheric pressure plasma. The system has a variable frequency alternating current (AC) power source, a transformer, a cable connected to a secondary winding of the transformer, a programmed microprocessor for control of power to the atmospheric pressure plasma. The microprocessor is configured to a) at pre-ignition, power the AC power source at an operational frequency $f_{op}$ higher than the resonant frequency $f_r$, b) decrease the operational frequency $f_{op}$ of the AC power source until there is plasma ignition, and c) after the plasma ignition, further decrease the operational frequency $f_{op}$ of the AC power source to a frequency lower than the resonant frequency $f_r$.

In one embodiment of the invention, there is provided a method for plasma ignition and maintenance of an atmospheric pressure plasma using the system above.

In one embodiment of the invention, there is provided a ballast transformer coupling power (for plasma ignition and maintenance) to a plasma, where the plasma ignition and maintenance is controlled in part by the system and the programmed microprocessor described above.

It is to be understood that both the foregoing general description of the invention and the following detailed description are exemplary, but are not restrictive of the invention.

BRIEF DESCRIPTION OF THE FIGURES

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE INVENTION

Figure 1A:
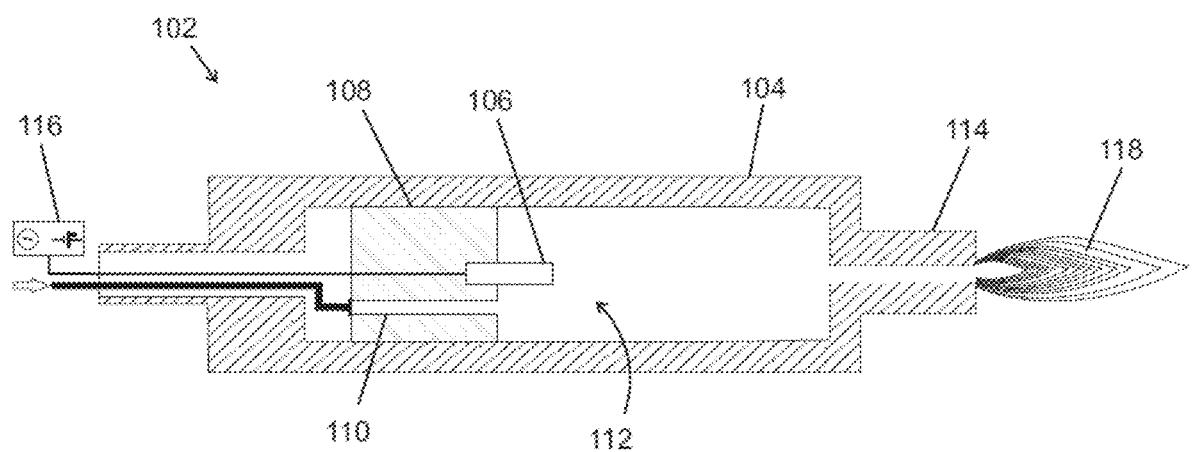
FIG. 1A is a schematic of an atmospheric plasma source.

FIG. 1A is a lengthwise cross-sectional view of an example of an atmospheric pressure (AP) plasma source 102. The AP plasma source 102 includes an axially elongated plasma-generating chamber 104 or other structure that serves as a ground electrode for generating a plasma and that serves as a conduit for flowing gases into the plasma. The plasma-generating chamber 104 may be enclosed in an electrically- and thermally-insulating housing (not shown). A "hot" or powered electrode 106 is located in the plasma-generating chamber 104. Electrical connections to the hot electrode 106 may be made through a dielectric structure 108 located at the proximal end of or in the plasma-generating chamber 104. One or more gas inlets 110 may be formed through the dielectric structure 108 in fluid communication with the plasma-generating chamber 104. The gas inlets 110 may be placed in fluid communication with a gas supply source. Accordingly, the gas inlets 110 provide a flow path for plasma-generating gas fed to plasma-generating region 112 within the plasma-generating chamber 104 proximate to the hot electrode 106. In operation, the plasma is generated in region 112 and subsequently flows (with the gas flow) toward a nozzle 114 positioned at a distal end of the plasma-generating chamber 104.

Generally, operating parameters associated with the AP plasma source 102 are selected so as to produce a stable plasma discharge. Control 116 having a processor is used for setting and controlling the operating parameters which depend on the particular application ranging, for example, from nanoscale etching of micro-fabricated structures or devices (e.g., microelectromechanical systems (MEMS) devices) to removing large areas of paint from aircraft carriers. Examples of operating parameters are provided below with the understanding that the teachings herein are not limited by such examples. In the case of generating an air plasma, the rate at which the air is fed to the AP plasma source 102 may range from $1 \times 10^{-6}$ SCCM to $1 \times 10^6$ SCCM. The feed pressure into the AP plasma source 102 may range from 1 Pa to $1 \times 10^7$ Pa. The power level of the electrical field driving the plasma may range from $1 \times 10^{-6}$ W to $1 \times 10^6$ W. The drive frequency of the electrical field may range from direct current (DC) (0 GaHz) to 100 GHz. The separation distance, i.e, the distance from the nozzle exit to the exposed surface of the material to be removed, may range from $1 \times 10^{-6}$ m to 40 cm. The scan speed, i.e. the speed at which the AP plasma source 102 may be moved across (over) the surface of the material, may range from $1 \times 10^{-9}$ s to $10^3$ s. Related to the scan speed and power is the time averaged power density. Also related to the scan speed is the dwell time, i.e., the period of time during which a particular area of the material is exposed to the plasma plume, which may range from $1 \times 10^{-9}$ s to $1 \times 10^3$ s.

In one embodiment of the present invention, AP plasma source 102 has a converging nozzle (i.e., a straight conical cross-sectional flow area without being followed by a diverging section), has been fabricated and evaluated. The AP plasma source repeatably and reliably produces a plasma plume which may include the production of shock waves. The AP plasma source generates an air plasma using air at about room temperature as the feed gas. The air may be fed to an AP plasma source of this type at a pressure ranging from 30-110 psi and at a flow rate ranging from 1-7.5 CFM. In another example, the pressure range is 65-95 psi. In another example, the flow rate range is 1-4 CFM. Pressures higher than 110 psi may also be implemented to produce shock waves. In a more general example, the pressure may be 30 psi or greater and the flow rate may be 1 CFM or greater.

Under these conditions, at plasma ignition, there is a (typically small) arc from the driven or "electrically hot" electrode to the chamber wall, and the gas flow "expands" the spatially confined arc into a diffused volume of plasma or plasma plume 118 extending out of the outlet 114. The electrical impedance before and after plasma ignition and during the expansion of the arc vary greatly as detailed below.

Figure 1B:
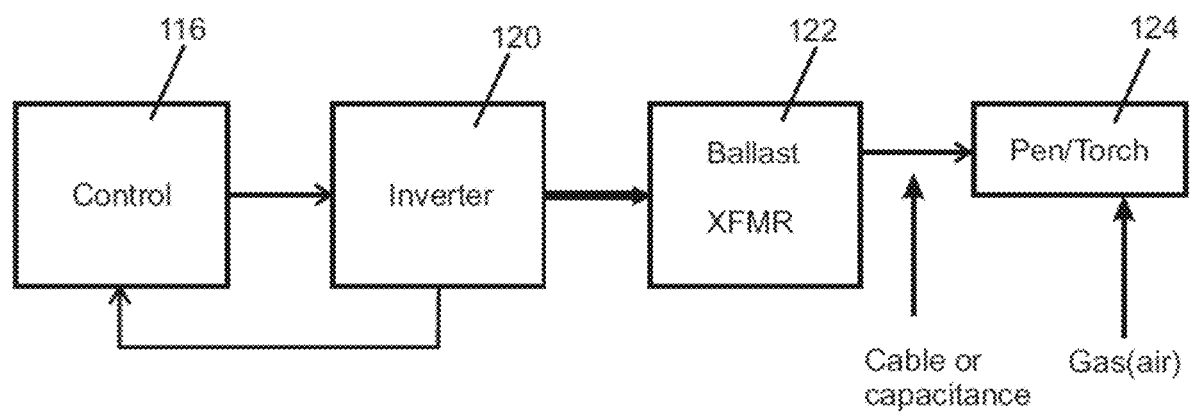
FIG. 1B is a schematic of a system for coupling power to an atmospheric plasma.

The present invention provides as shown in FIG. 1B a system for providing power to the plasma during these changing load resistance conditions by way of an inverter 120 (controlling for example the AC frequency of a square wave pulse signal) and a ballast transformer 122. In this system, a leakage inductance of the ballast transformer 122 serves the purposes of both a) limiting the current into a variable load when driven by a fixed voltage AC source and b) providing a resonance with cable capacitance and therefore can provide a high voltage to ignite a plasma.

Figure 2:
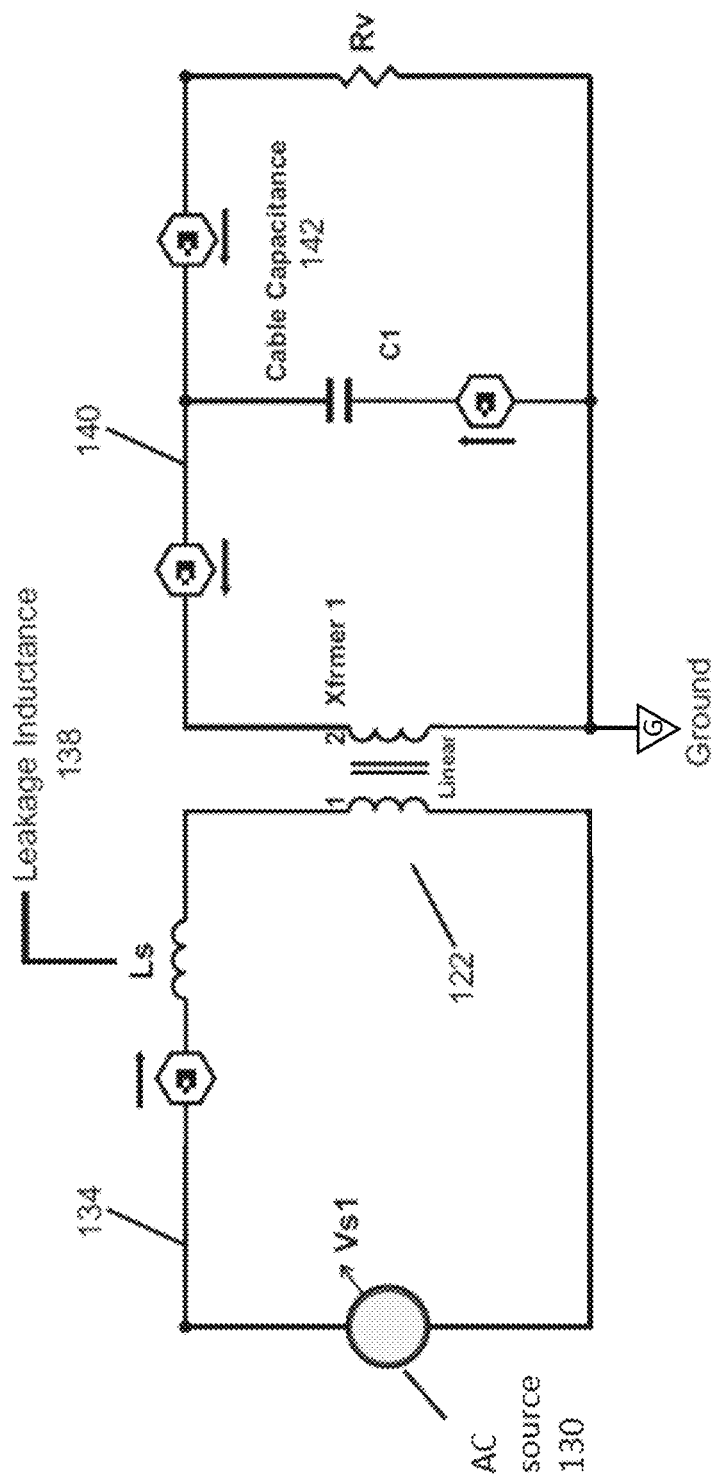
FIG. 2 is a schematic circuit model of a ballast transformer coupled to a variable resistance load.

FIG. 2 is a schematic circuit model of asymmetric ballast transformer 122 of the present invention for coupling to a variable load Rv such as a plasma load, including but not limited to an atmospheric pressure plasma pen (discussed above) or a cutting torch (discussed below). As shown in FIG. 2, an AC voltage source 130 is coupled to transformer 122 by coupling connections 134. The AC voltage source can provide an AC waveform which may be sinusoidal, square wave, or other arbitrary pulsed or bi-polar waveform, and provide a waveform whose frequency can be varied. The voltage source 130 supplies current which flows through the primary windings 1. The current through windings 1 induce current flow through the secondary windings 2 of transformer 102, producing a step up or step down AC voltage which appears across the variable plasma load $R_v$. A coaxial connection 140 is used in this circuit to connect the transformer 122 to the variable plasma load $R_v$, but other types of electrical interconnects with or without filtering could be used in addition or instead of the coaxial connection 140. As shown in FIG. 2, a leakage inductance 138 and a cable capacitance 142 (from the coaxial cable) appear in this circuit.

In general, ballast transformers have a leakage inductance that appears in a simple analysis as a separate inductor (leakage inductor) in series with the primary and or the secondary. If the leakage inductance is sufficiently large, the present inventors have realized (as noted above) that this leakage inductance will serve both to a) limit the current into a variable load when driven by a fixed voltage AC source and b) provide a resonance (with the cable capacitance) and therefore can provide a high voltage to ignite a plasma.

Existing transformers with a two pole or three pole transformer core require either a larger core with lower magnetic path length to cross sectional area ratio and extra magnetic path extension in the transformer core in order to reduce coupling to an acceptable value where a transient load would not adversely affect a voltage source such as voltage source 130. Alternatively, the transformer would need finer wire with more turns and thick bobbin walls for a coaxial design on a two pole transformer core in order to suppress current surges. Both of these approaches are undesirable.

Accordingly, the present inventors have realized that, for a conventional two pole core design to suppress current surges, a set of large bobbins along with a fine wire size would be necessary. Indeed, because of the limited wire sizes that are practical, many turns would be necessary to achieve a sufficient flux density. Yet, this approach comes with excessive wire heating even for a 1-3 kW transformer for example having a ~50-100 mm (height and width) 2 pole transformer core, with a core area of each pole being ~320 $mm^2$-600 $mm^2$. Furthermore, the present inventors have realized that, if only a single primary winding were placed on one pole of the core and only a secondary winding were on the other pole, then it is impossible to obtain coupling as high as 0.97.

Accordingly, using conventional measures, one either a) obtains a transformer with limited power rating or b) cannot obtain enough coupling. These deficiencies are especially problematic when the variable load is a plasma, where the on state and the off state present a tremendous change in impedance nearly instantly, which can result in excessive current flow and damage to the power supply and power coupling equipment.

Asymmetric Ballast Transformer

In view of the problems noted above for the ignition and operation of an atmospheric pressure plasma, the present inventors utilized a two pole winding design with a coaxial winding of a second primary winding on the secondary side of a transformer, This solution provides an asymmetric ballast transformer permitting adjustment of the primary windings so that some of the primary windings are on the primary pole and the rest of the primary windings are disposed in a vicinity of and preferably coaxial with the high voltage secondary coil on the second pole.

Figure 3:
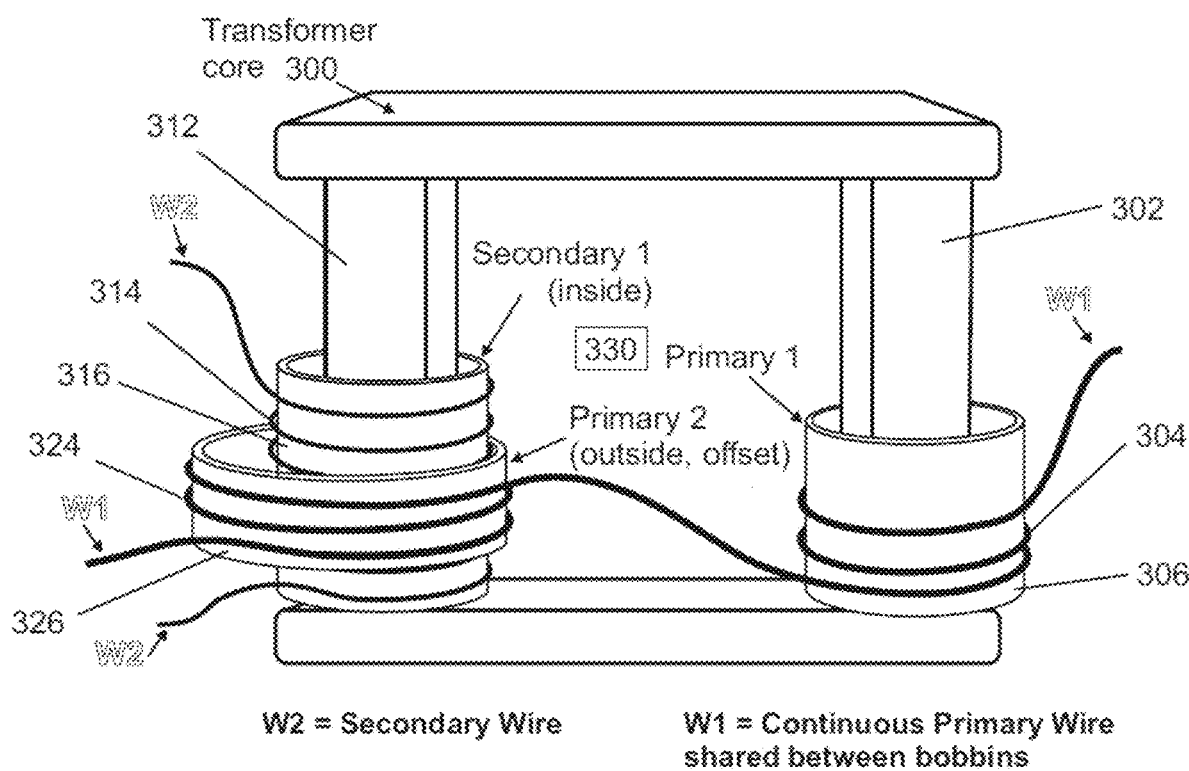
FIG. 3 is a schematic of an asymmetrical ballast transformer of the present invention.

FIG. 3 is a schematic of a ballast transformer of the present invention. As shown in FIG. 3, a magnetic flux circuit comprises a transformer core 300 forming a magnetic loop (which could include air gaps not shown) linking a primary side 302 of the transformer to a secondary side 312 of the transformer. The primary side 302 comprises a first primary winding 304 of wire W1 on bobbin 306. Wire W1 connects to an AC power source (not shown in FIG. 3), but similar to voltage source 130 in FIG. 2. The secondary side 312 comprises a second winding 314 of wire W2 on bobbin 316. Wire W2 connects to a variable load not shown in FIG. 3, but similar to variable load Rv in FIG. 2.

In FIG. 3, bobbin 316 is illustrated for a high voltage secondary. Bobbin 316 has wire W1 wound around it. In one embodiment of the invention, bobbin 316 fits inside primary bobbin 326 to provide coupling thereto. The position of primary bobbin 326 on the second pole can vary from design to design to provide an adjustable coupling to the secondary winding 324 and/or to the transformer core 300. Primary bobbin 326 typically has a lower coupling to the transformer core than either the secondary winding 324 or the primary winding 304 on bobbins 316 and 306, respectively.

In one embodiment of the invention, the required number of turns for the transformer's primary are distributed between the two primary bobbins 306 and 326 in order to set the coupling for an appropriate leakage inductance, while the total number of windings on the primary bobbins remains the same as if there were only one primary bobbin, thus obtaining appropriate excitation or magnetization inductance, and thereby controlling maximum flux while allowing larger wires on the bobbins than otherwise would be the case when the primary windings were coaxial on only one pole. In one embodiment of the invention, bobbin 326 is insulated although insulation may not be necessary if bobbin 326 is of a size to where it can reside at the bottom of the secondary winding where the voltage is lower than at the top side of the secondary windings.

Accordingly, in one embodiment of the invention, the primary winding on transformer core 300 is split by the presence of second primary winding 324 in proximity to (e.g., wrapped around or coaxially surrounding) the secondary winding 314. This second primary winding 324 (connected in series with the winding primary winding 304) can be a non-coaxial and/or a coaxial winding relative to the secondary winding 314 so that it is possible to control the coupling coefficient (leakage inductance) and optimize the trade-off between maximum flux density, core heating, and wire losses without the necessity of auxiliary adjustable flux paths. In one embodiment, the relative positions of bobbin 306, bobbin 316, and/or bobbin 326 to the transformer core (and/or to each other) can be adjusted or can otherwise be fixed at different relative positions.

In one embodiment of the invention, by keeping the number of turns constant, the exact coupling may be adjusted by moving turns from primary 1 (winding 304) to primary 2 (winding 324) or vice versa. In effect, turns can be moved back and forth between primary bobbins to adjust the coupling and leakage inductance. If more turns are on primary 2 and less on primary 1, then the coupling is increased without affecting the turns ratio or open circuit (no load) output voltage. Reversing the situation, more turns on primary 1 and less on primary 2 decreases the coupling. Less coupling makes the leakage inductance increase while more coupling makes it decrease.

The numerical values given below are merely illustrative and not limiting of a asymmetrical ballast transformer of the present invention. Typical values for operation of the ballast transformer of the present invention are 0-350 mTeslas, 0.97 coupling on primary, net loss <50 W between 20-500 kHz, 1 kV-50 kV peak volts pre-ignition, 0.50-5 kV volt peak operating, 0 volts output post-ignition state.

Below are details of a constructed asymmetrical ballast transformer of the present invention.

Ballast Transformer Design

Operational Input: Pulsed 300 V above ground signal at pulse frequency from 20-500 kHz
Transformer Design:
  Primary Rating: 230 VAC
  Epoxy coating or other coating to hold primary wire and secondary wire in place on bobbins and to prevent vibration in use.

First Primary Winding: wire size #12 AWG, 1-15 turns
First Primary Winding Inductance: 0.5-10 µH at 10 KHz, no core
Second Primary Winding: wire size #12 AWG, 1-15 turns
Second Primary Winding Inductance: 0.5-10 µH at 10 KHz, no core
Total Primary Windings: 2-30 turns
Total Primary Winding Inductance: 500-2000 µH at 10 KHz, with core, Q=300
Secondary Winding: wire size #22 AWG, ~200 turns, layered windings
Secondary Winding Inductance: 100 to 1000 µH at 10 kHz, no core
  50 to 5000 mH at 10 kHz, with core, Q=500
  Measured Leakage Inductance: 5-100 µH at 10 kHz, with core, Q=30

A further embodiment of the present invention is that bobbin 326 can be disposed offset from the transformer core, that is that the primary wire W1 on bobbin 326 is moved away from the core (where the operating flux and thus heating is the greatest). Flux near wire W1 is somewhat higher than elsewhere in the core.

Further, in another embodiment, the bobbin may be perforated for air flow or liquid cooling tubes along the core inside of the winding. In some cases, it is also advantageous to offset bobbin 326 on the core to allow more wire exposure into the window region 330 of the transformer core, and thereby move the magnetic flux distribution in the core to prevent localized saturation of the core. FIG. 3 shows bobbin 326 in one offset position, but it is also possible to have bobbin 326 centered around bobbin 316 and to only offset bobbin 306 on the primary side of the transformer.

Coil layers of the windings on the bobbins may also be separated for better cooling and less current crowding. Flux is not the same around the core during any mode of operation since the circuit with capacitive output causes significant circulating current so that the circulating power is typically 1.6 times the real output power. Such a relationship is necessary for ballasting. The transformer core may be un-gapped for maximum power output, but in another embodiments a gapped core is utilized to minimize saturation. This design does not necessarily have, but could utilize, a center tapped primary although center tapping would reduce power handling and/or increase size.

In one embodiment of the invention, the primary bobbin 306 (as noted above) is offset from primary side 302 of the transformer core. This offset allows magnetic flux to leak out and be intercepted by second primary winding 324 wound on bobbin 326.

In one embodiment of the invention, one of the primary or secondary windings provides tight coupling while the other provides loose coupling while simultaneously providing a) enough leakage inductance to limit flux density to a safe level, b) at least a turns ratio to develop the operating or developed plasma voltage and more, and c) a reasonable leakage inductance for resonance condition for ignition and use that same leakage inductance for ballast when there is a developed plasma. In one embodiment of the invention, the leakage is adjusted by construction of the ballast transformer components so as not to change the turns ratio all the while keeping the transformer compact while avoiding extra ferrite flux path elements.

In one embodiment of the invention, it is desirable to minimize interwinding capacitance. As shown in FIG. 3, there is a two 'pole' ferrite core but the primary is not wound over the top of the ferrite core and the secondary is not wound over the top of the ferrite core. This is to avoid electrostatic stray capacitive coupling between the primary and secondary. Furthermore, in one embodiment of the invention, one part of the primary coaxial to the secondary is at the 'grounded' or low voltage end. This arrangement further reduces the effect of stray capacitive coupling by grounding that end of the secondary winding. At plasma ignition, the plasma impedance transitions very quickly between very high (megOhms or greater) impedance to a near short circuit (less than an Ohm). This means the load voltage on the plasma electrode drops rapidly (for example in a very few nanoseconds) which can generate a large capacitively coupled transient into the primary which can damage the drive devices in control 116 or inverter 120 like IGBTs or FETs. In one embodiment of the invention, this effect is minimized by the open top ferrite core design shown in FIG. 3, reducing the interwinding capacitance between the primary and secondary winding.

Figure 4:
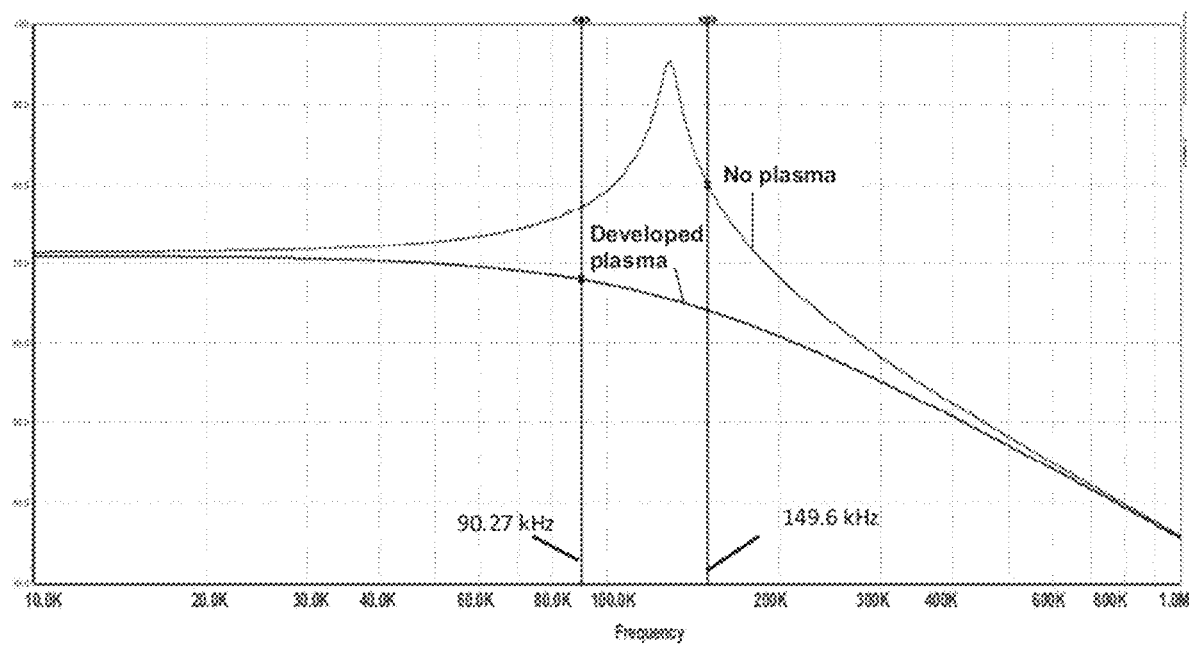
FIG. 4 is a schematic graph of frequency vs impedance sweep of using a ballast transformer for different loads.

FIG. 4 is a graph of frequency vs impedance sweep characteristic of the ballast transformer circuit for a "no plasma" case and for a developed plasma case. Two points/frequencies marked are for plasma operation (to the left, 90.27 kHz) and pre-ignition (to the right, 149.6 kHz). These frequencies will vary with a particular coax cable type and length (FIG. 2, coaxial cable 140 and its cable capacitance 142). If the cable capacitance changes, the operating points/frequencies change for the same output. Note the scale depicted is magnitude dB relative to 1 volt at the output of the cable (i.e. at the pen/torch/plasma port). 80 dB volt is 10,000 volts. 68 dB volt is 2,500 volts amplitude or peak. In FIG. 4, the no plasma curve represents a very high load impedance (here calculated for 100 k Ohms, but it may be 1 Meg Ohm or higher). In FIG. 4, the fully developed plasma curve represents a load of 2000 Ohms. The type of plasma pen/torch used for these calculations was assumed to be a high voltage plasma type with a relatively high impedance while running.

In one embodiment of the invention, the frequency of operation can be moved from 149.6 kHz toward a lower frequency (toward the peak resonance frequency) in order to develop higher ignition voltages (than would exist at 149.6 kHz) and thereafter moved to even lower frequencies (once ignited) to couple more plasma power once ignited and developed.

Figure 5:
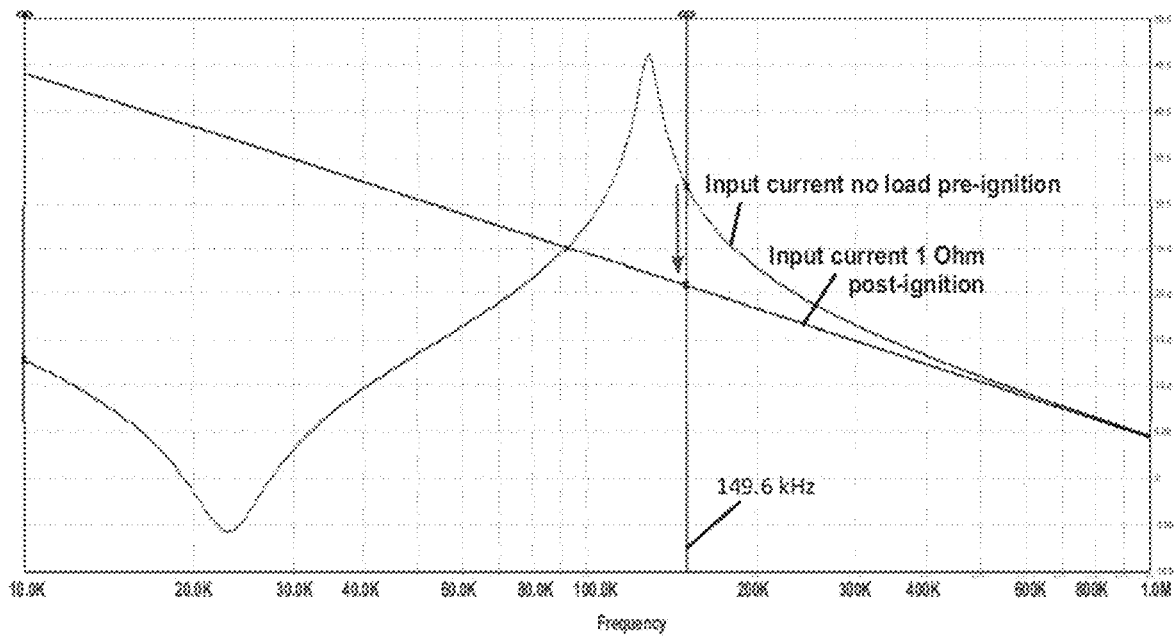
FIG. 5 is a schematic graph of a current transfer frequency sweep for different loads coupled to a ballast transformer, one with no load (pre-ignition of plasma) and the other at post-ignition.
Figure 6:
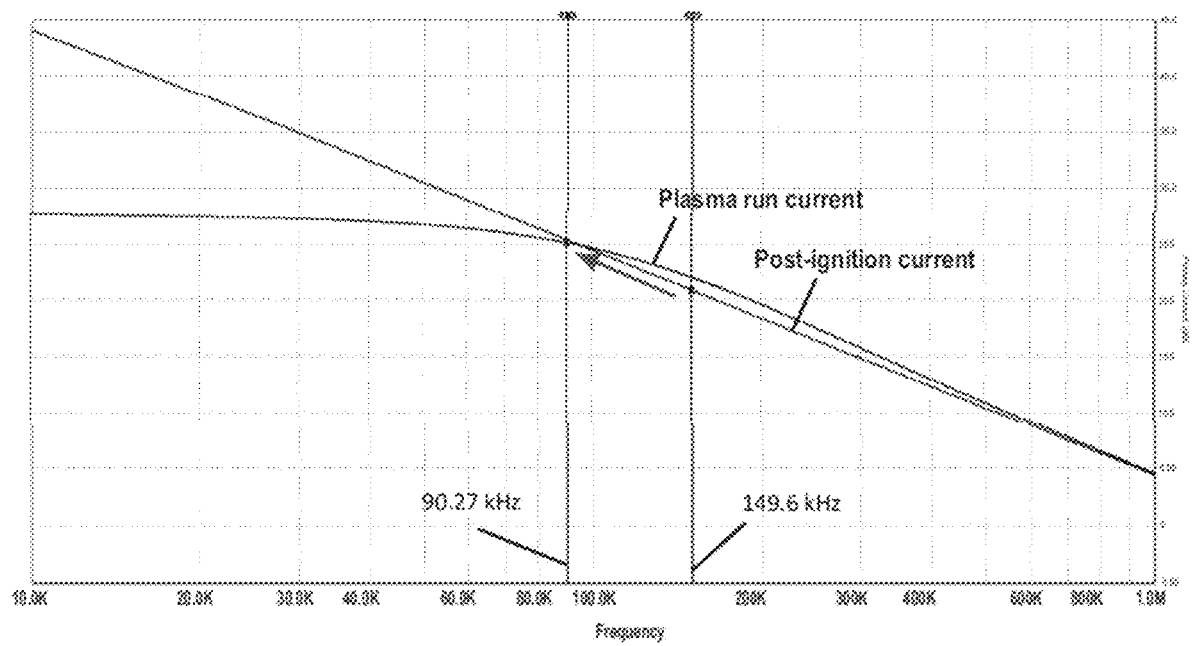
FIG. 6 is a schematic graph of a current transfer frequency sweep for a post ignition plasma load and a fully developed plasma load.

One plasma condition that is not shown in FIG. 4 is the state immediately post ignition when the plasma is spatially confined into a conductive filament, small in size, and has an impedance of 1 Ohm or less. This condition is depicted in FIG. 5, a graph comparing input current for pre-ignition and post-ignition. In FIG. 5, the scale on the right is in dB Amperes relative to 1 Ampere peak. Specifically, FIG. 5 shows the input current as a function of frequency for a no load pre-ignition, and shows the input current as a function of frequency for a 1 Ohm post-ignition state (not a fully developed plasma). At startup, the input current with no load condition (simulation is 100 k Ohms) is at about 32 dB or 39.8 Amperes peak. When the plasma ignites, the input current is relatively small and has a relatively low impedance as compared to the fully developed plasma state and simulated here with a resistance 1 Ohm. Note that the input current at plasma ignition actually drops to about 21 dB or 11.2 Amperes peak. Thereafter, as shown in FIG. 6, the plasma develops and the input current increases as the frequency of operation is lowered to 90.27 kHz or lower.

More specifically, as the plasma develops, the impedance increases moving the current from the post-ignition current curve to the plasma-run current curve, and the frequency is adjusted to 90.27 kHz in this example to develop full power. Thus, the ballast transformer is used to permit the system to generate ignition voltages (FIG. 4), withstand the sudden load transition from very high to near shorted conditions (FIG. 5) and then smoothly move to full power plasma (FIG. 6).

Figure 7:
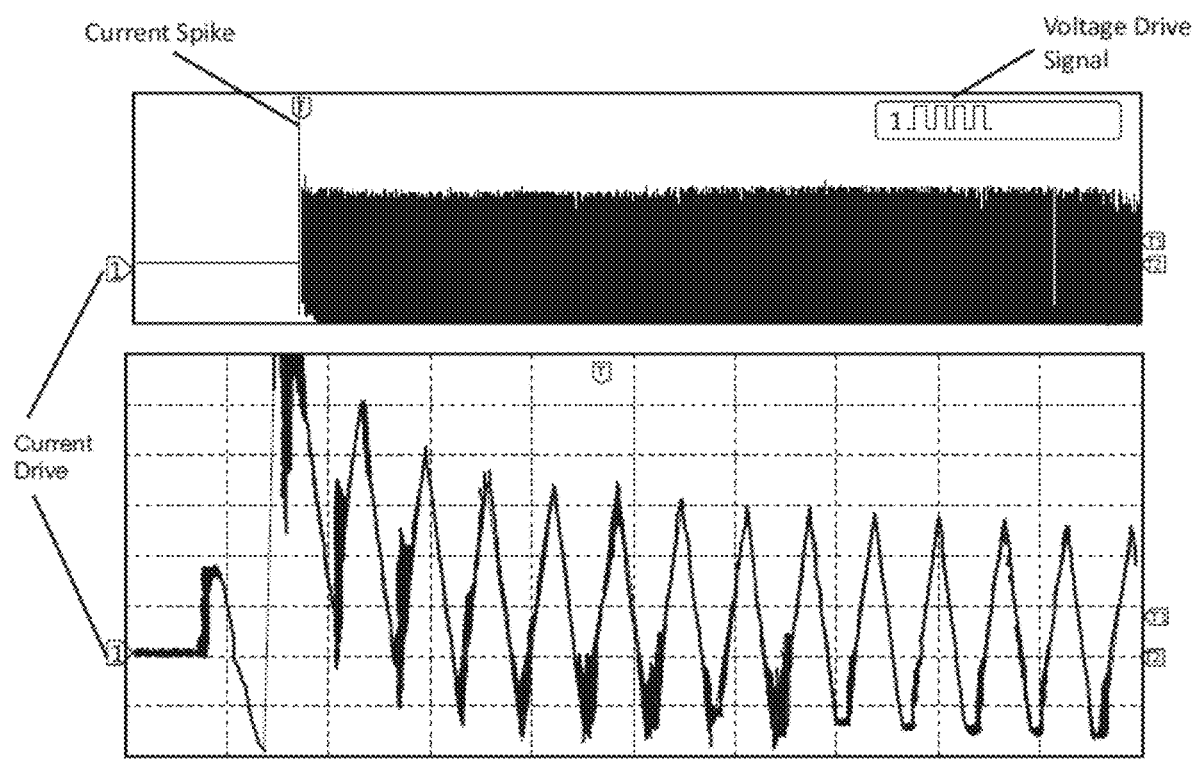
FIG. 7 is a schematic depicting a measured current trace at the moment of ignition.

FIG. 7 is a schematic depicting a measured current trace at the moment of ignition taken with a current sample transformer (CST) plus load (current sample transformer and resistive load). The schematic shows that the current was "kicked" very far off nominal to around double normal peaks.

Figure 8:
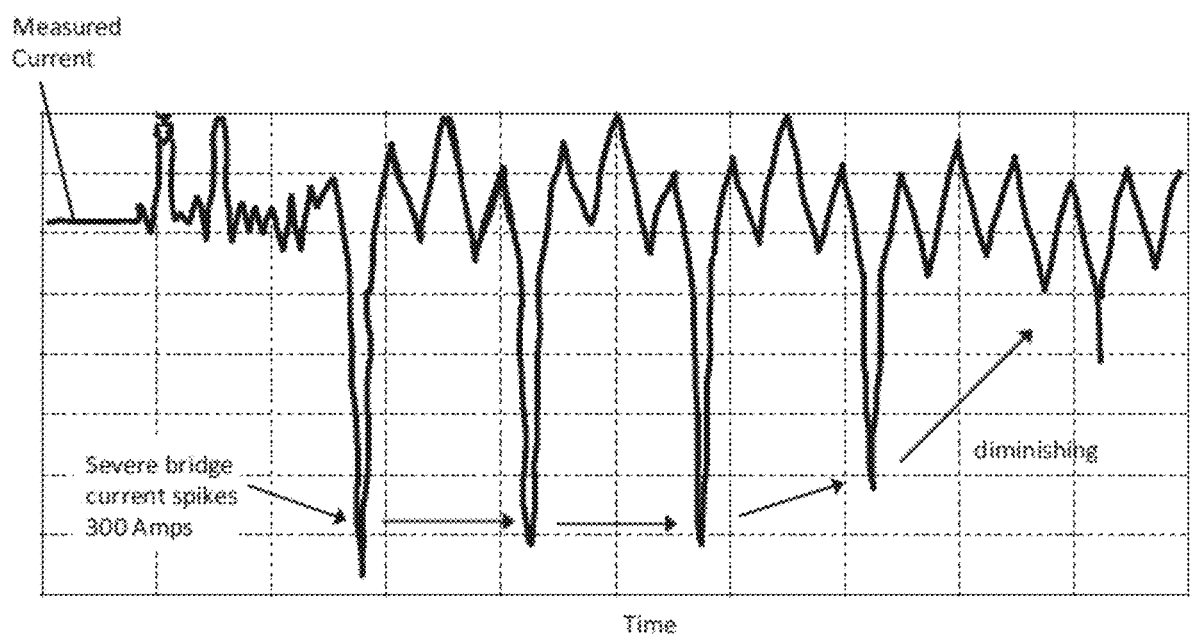
FIG. 8 a schematic depicting measured current traces when the ignition and current kick have produced transformer core saturation.

FIG. 8 is a schematic depicting measured current traces when the ignition and current kick have produced transformer core saturation resulting in current spikes. After ignition, the current and therefore core flux goes high enough that the leakage inductance begins to saturate and disappear leading to extremely high currents since at this time the steady-state plasma condition is not developed and its impedance is just one or two Ohms. Such conditions can destroy the transistor bridge devices.

Moreover, 1) ringing, 2) current reversals, and 3) high 'saturation' currents can damage commutator diodes in the active devices if the voltage and current are reversed quickly before forward conduction recovery time, resulting in a high power dissipation condition. A common method to combat this problem is to put capacitors across the active devices and thus diodes. Unfortunately, the current kick and fly-back currents from leakage inductance and capacitors can compromise dead time and produce bridge shoot through.

Figure 9:
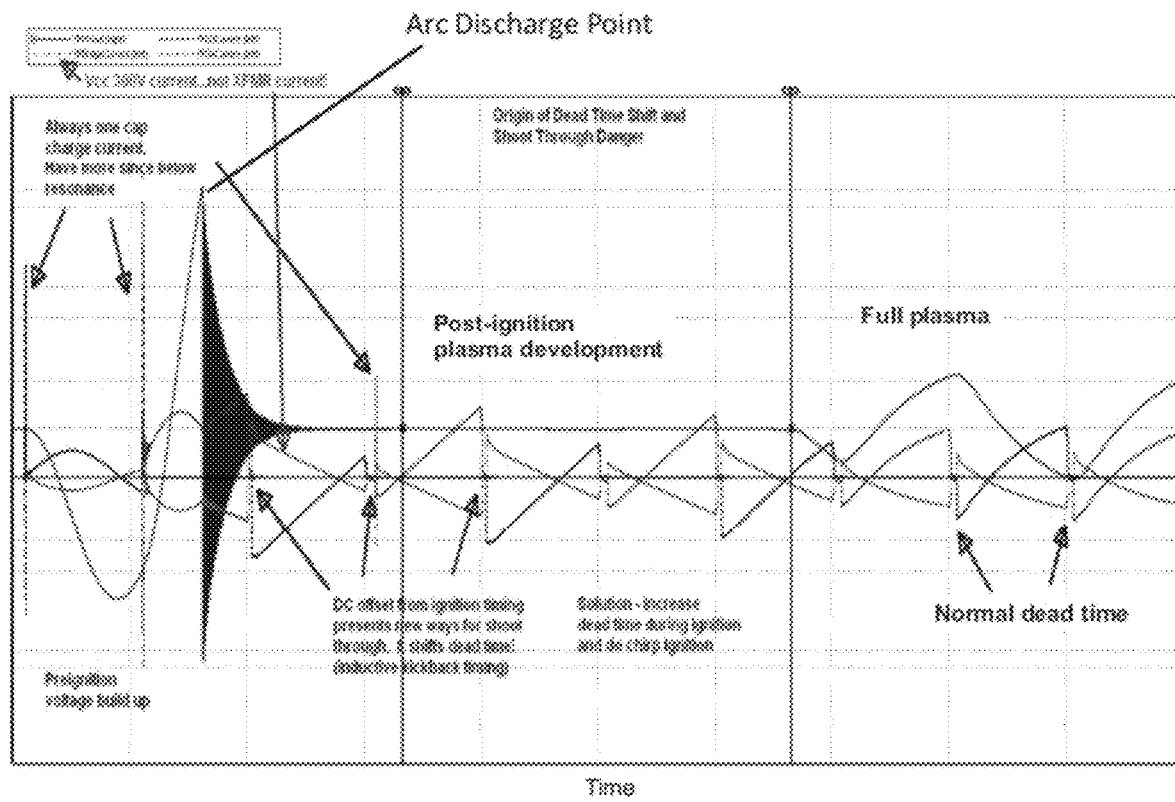
FIG. 9 is a schematic depiction showing a computer analysis of the circuit shown in FIG. 1.

FIG. 9 is a schematic depicting simulation of ignition with an "offset current kick." This ignition simulation shows output voltage trace and output device currents. Such systems commonly often use full pulse width drive with only enough dead time to avoid 'shoot through' in a bridge transistor string. However, the current 'kick' (called DC offset) will change the effective dead time by extending commutator diode conduction time which risks shoot through in the bridge transistor string. This situation occurs because transistor current was not zero and changed slope or di/dt at the moment of ignition. That is, when plasma ignition occurs at some unknown time in the drive cycle with other than a zero magnitude of the instantaneous bridge/transformer plasma drive current, the transistor bridge is at risk of self-destruction.

Figure 10:
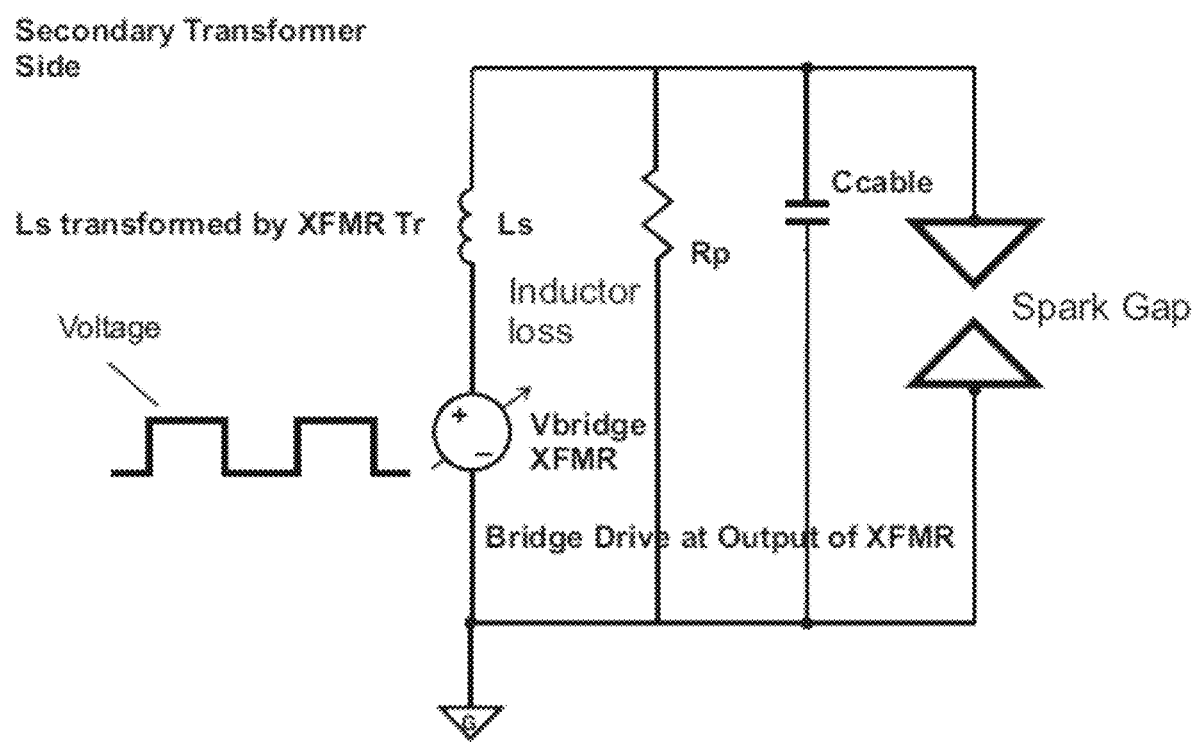
FIG. 10 is a schematic of a reduced circuit for the secondary transformer side.

The present invention addresses this problem by providing a minimal amount of voltage to ignite a plasma or spark in the electrode gap and no more, thereby avoiding transistor bridge drive damage by using the present invention's frequency chirp ignition. FIG. 10 is a schematic of a reduced equivalent secondary circuit of a ballast transformer plasma generator circuit. This circuit has the transfer voltage response in FIG. 4, with the tallest voltage peak for 105 Ohms (or larger). If this circuit is driven by a voltage source near (but offset from) resonance, then the voltage across the spark gap will increase until a loss occurs in the system, for example resistive and/or inductive losses, which consumes the input energy. As the operating frequency is brought closer to the resonant frequency, at some point, there is enough quasi-steady state voltage to ignite plasma. At that time, the ballast transformer output current and the output voltage will nearly have the relationship as they would have at resonance, as shown in FIG. 9 in which the instantaneous voltage and current are out of phase with the peak voltage occurring when the instantaneous current is near or substantially zero.

Figure 11:
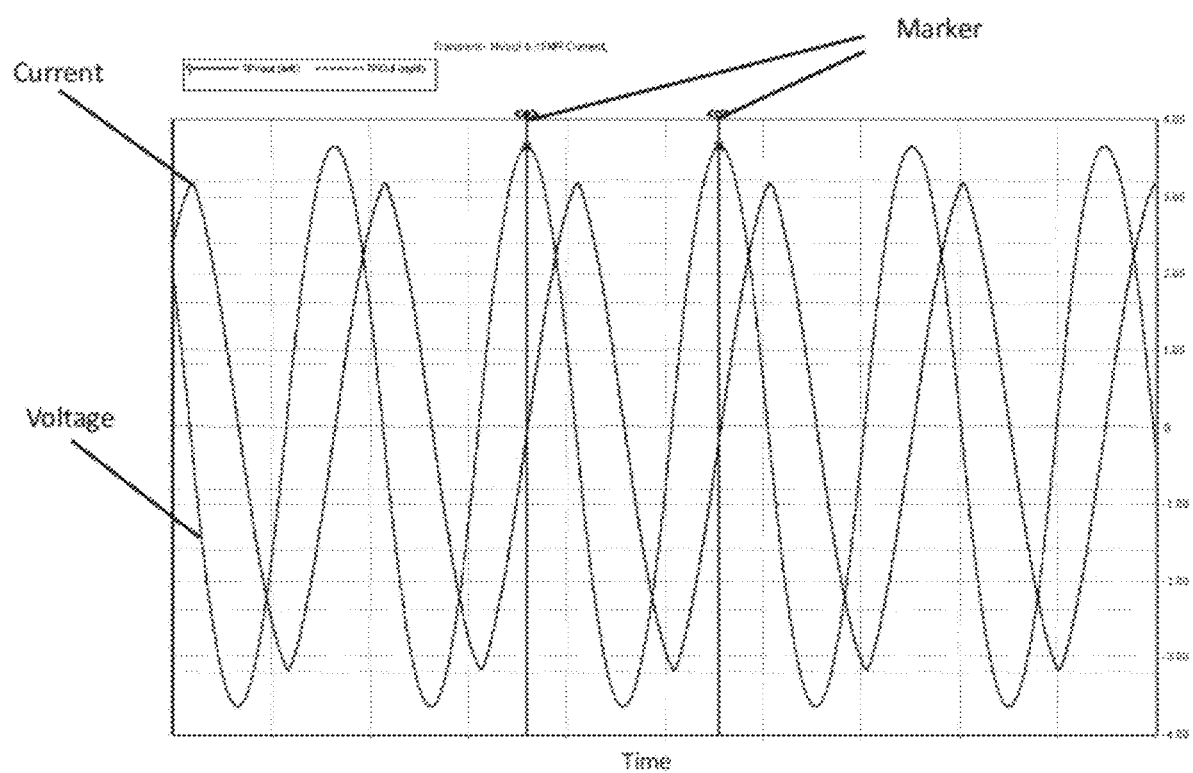
FIG. 11 is a schematic of the AC current and AC voltage on the secondary transformer side, prior to plasma ignition and operating at a frequency offset from resonance.

FIG. 11 is a schematic depiction of the voltage and current in the circuit of FIG. 10 at 170 kHz. The resonant frequency in this example is 150 kHz. The markers on FIG. 10 are placed at peak output voltage, which represents just enough voltage (electric field in the gas) to ignite the plasma. Even though somewhat off-peak resonance, output current is nearly zero and thus there is very low flux density and stored magnetic energy. The stored magnetic energy is substantially all in the cable capacitance. If an arc initiates in the electrode gap and becomes a short (low impedance), current will increase smoothly from zero and not be affected by a reverse slope from a non-zero output, and therefore not drive input current to high values.

If the initial drive frequency is set at well above the resonance (1.5 to 2.5 times) or even higher, depending on bandwidth (BW) of the resonance, and set to an operational frequency well outside any significant resonance response, then the sudden appearance of drive will not have sideband components that excite the resonance frequency of the secondary side of the ballast transformer. This is an important (but non-limiting) aspect of this invention which can prevent premature ignition. After plasma ignition, the drive or operational frequency is gradually reduced at a rate where frequency modulation components will not tend to excite the resonance as it approaches the resonance frequency, else the voltage increase will not be smooth, but will have a ringing envelope. A rate of frequency change of 10× slower than the BW/2 Hz per 0.6/BW seconds is a suitable rate of frequency change.

In about 1 millisecond to 100 ms, the system comes to the near resonance condition in FIG. 11. In one embodiment of the invention, a dwell time of 0.1 to 50 milliseconds at the near resonance condition is enough time for the electrode gap to ignite for a few nanoseconds but at a peak voltage that alone is not enough to guarantee ignition. In one embodiment of the invention, 100's of cycles over a few milliseconds at the same voltage will give enough time to ignite. Also, the sweep step size or rate must not be so high that there is a danger that a single step will make a very large increase in voltage else the plasma system will be in the same dangerous condition as originally mentioned. In one embodiment of the invention, a step size that makes 10% voltage change near ignition would be the maximum step size as this would allow current to rise to 10% of maximum before ignition. In one embodiment of the invention, since the operational frequency where ignition is expected to occur is not precise, the operational frequency (where plasma ignition is expected) can be sweep below the predetermined ignition frequencies, but not below resonance.

Chirp Plasma Ignition and Plasma Maintenance Control

Figure 12:
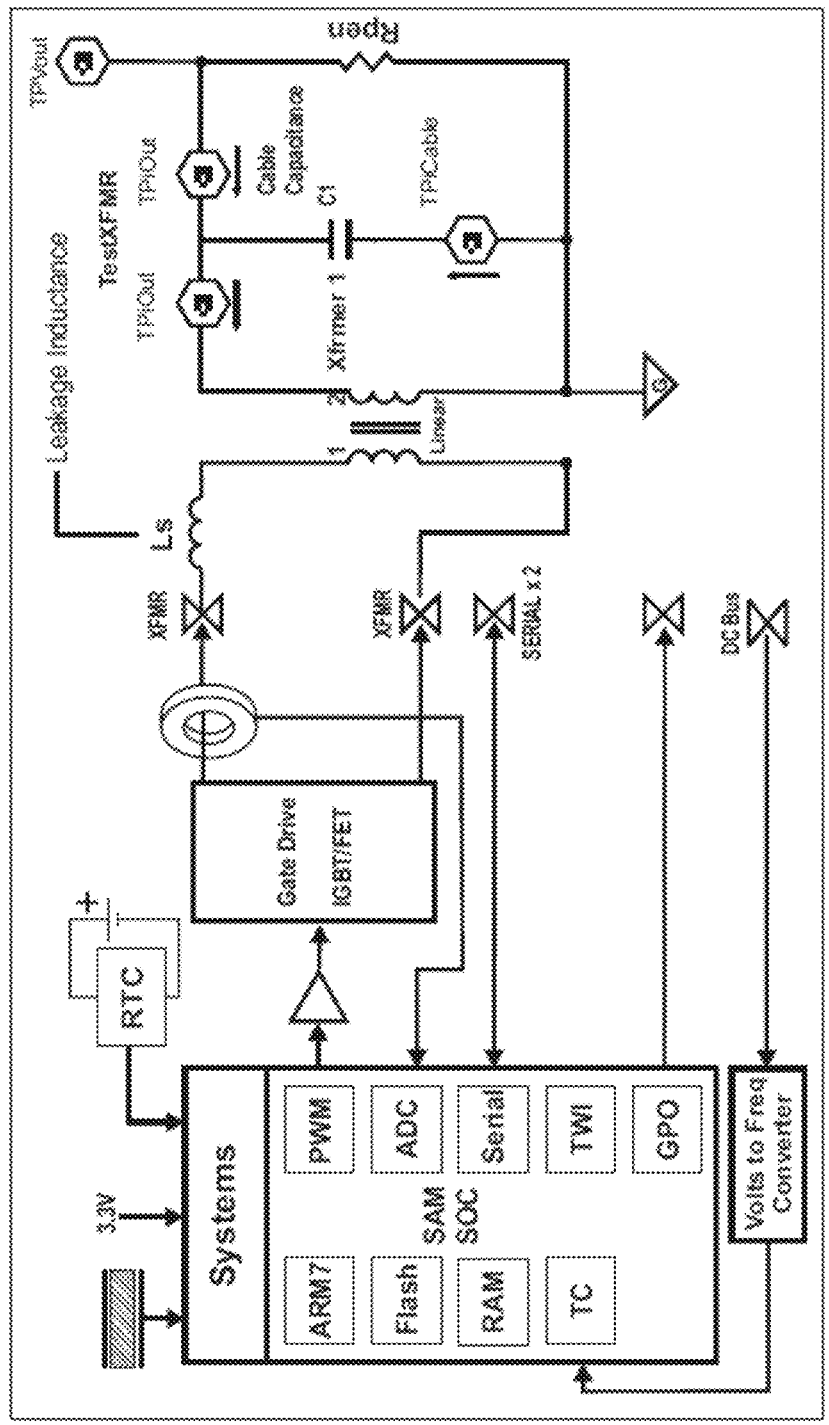
FIG. 12 is a schematic of a system on chip (SOC) for ignition and maintenance of an atmospheric pressure plasma.

FIG. 12 is a schematic of a system on a chip (SOC) integrated circuit for control plasma ignition and maintenance. The SOC has an advanced reduced-instruction-set machine (ARM) microcontroller which generates a drive signal for a transistor bridge which is connected to the ballast transformer shown on the right. Before ignition, $R_p$ en will be 100 k Ohms or higher. A current sense transformer (CST) is connected between the gate/drive transistors. The CST has an appropriate internal load resistance such that maximum current in Amperes is scaled to within range of the analogue to digital converter (ADC) on the SOC. Other items shown are common but not required. Software in the SOC starts the chirp ignition sequence as described above and initiates analog to digital conversion (ADC) of voltage and therefore current measurements. The initial drive frequency is as described above. This is reduced to perhaps 30% of the resonance which is 50% of the initial drive frequency. Current and/or voltage is monitored for ignition. It is not desirable to sweep below resonance because the circuit is capacitive reactive there and produces strong switching current spikes.

Figure 13:
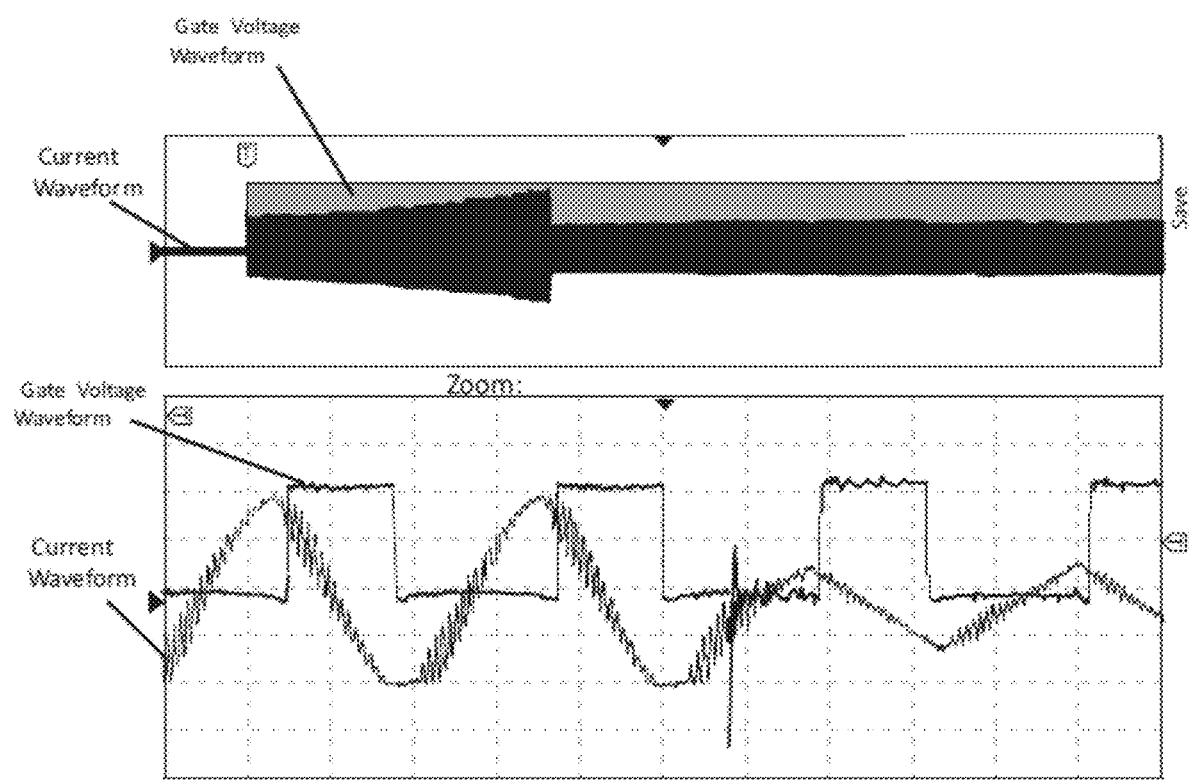
FIG. 13 is a schematic depicting current and gate voltage waveforms at the time of chirp plasma ignition and the transition of the waveforms as the plasma develops from the arc ignition and later as the operating frequency transitions to the resonant frequency.

An inverter current waveform output, hence the transformer input current and a H-bridge gate drive voltage trace of a chirp ignition using the present invention is shown in FIG. 13. The fast and small value signal superimposed on the current trace is inconsequential, and can be filtered out of all circuits and data elsewhere. The bottom trace is a 'zoom' view of the top trace about the point in time for plasma ignition where the increasing sinusoid pattern for the current waveform (prior to plasma ignition) transitions suddenly to a lower amplitude sawtooth waveform (after plasma ignition). The bottom trace shows no current spikes during this transition, and the drive current waveform transitions to more of a sawtooth wave than a sinusoid wave (which existed prior to plasma ignition).

Looking at the top half, the input current and therefore the output voltage gradually increase. At resonance, a resonant circuit has the surge impedance of:

$$Z_o = \sqrt{\left(\frac{L_s}{C_{cable}}\right)}$$

Then $V_{out}=I_{out} \times Z_o$ where $I_{out}$ is output current $V_{out}$ is output voltage. $I_{out}$ is $I_{in}/T_r$ where $I_{in}$ is bridge transistor supplied input current which has been measured by the microcontroller via the ADC, and $T_r$ is the known output XFMR turns ratio.

In one embodiment of the invention, the microcontroller can calculate $V_{out}$ approximately to confirm that the sudden change in current characteristics is the ignition. Note in FIG. 13 that the spike or transient in the gate voltage drive waveform is the plasma ignition, and that the plasma ignition occurred near zero current with no large current transient occurring. Furthermore, the current sample is clipped at the bottom by a clamp diode so that the zero point current is slightly offset downwards.

The advantages of using this method for controlled high to low frequency chirp drive plasma ignition are:
- there is no significant current kick during ignition which would jeopardize drive devices from this high current;
- there is no significant current kick during ignition which would possibly saturate a ballast transformer core which then could jeopardize drive devices through high current from loss of ballasting inductance and current flow under conditions with a very low, near zero load after plasma ignition;
- a current transient is not propagated backwards to the drive and microcontroller circuits causing possible resets and improper operation; and
- it is possible to calculate the approximate ignition voltage from input current alone to detect ignition gap wear.

Computer Control

It will be understood that the control 116 schematically illustrated in FIGS. 1A and 1B may also be representative of one or more types of user devices, such as user input devices (e.g., keypad, touch screen, mouse, and the like), user output devices (e.g., display screen, printer, visual indicators or alerts, audible indicators or alerts, and the like). Control 116 may have a graphical user interface (GUI) controlled by software for display by an output device, and one or more devices for loading media readable by the controller 212 (e.g., logic instructions embodied in software, data, and the like). The control 116 may include an operating system (e.g., Microsoft Windows® software) for controlling and managing various functions thereof.

Figure 14:
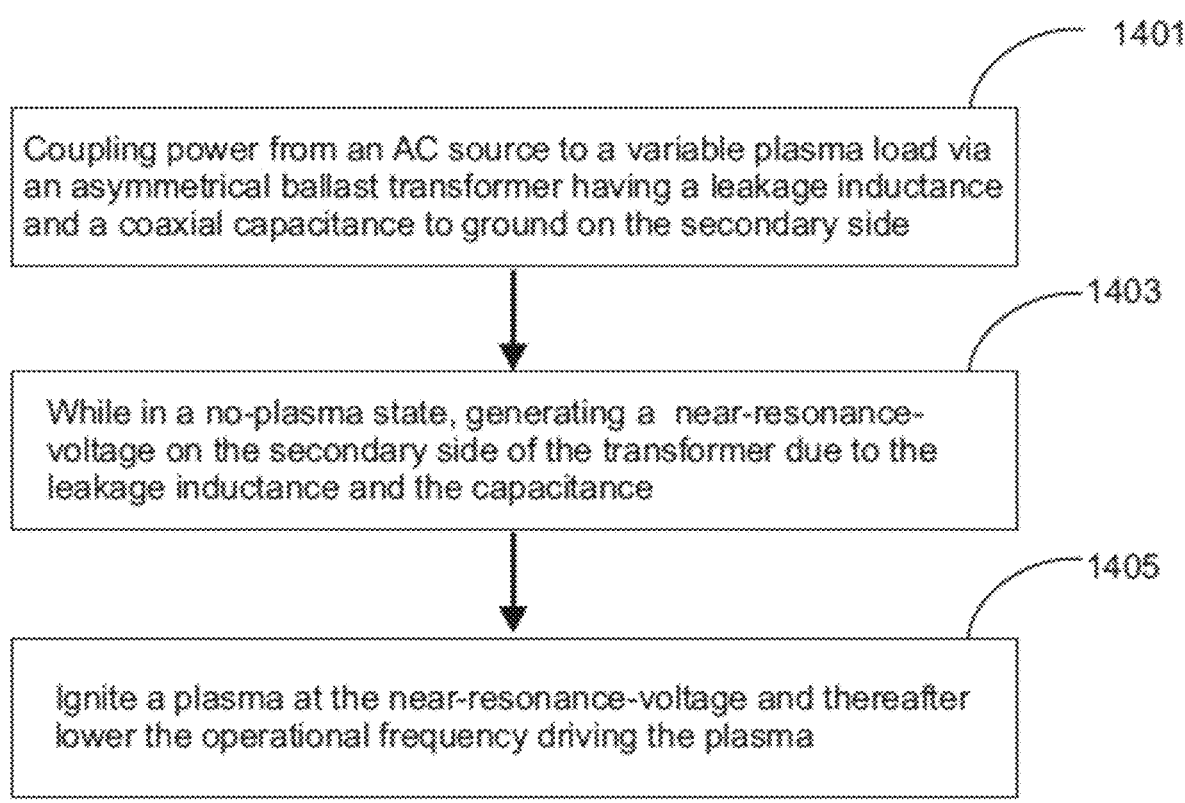
FIG. 14 is a flow chart detailing a method of the present invention for ignition and maintenance of an atmospheric pressure plasma.

FIG. 14 is a flowchart detailing a method of the present invention for powering a plasma load.

In step 1401, coupling power from an AC source to a variable plasma load via an asymmetric ballast transformer having a leakage inductance and a coaxial capacitance to ground. The variable plasma load comprising for example the atmospheric pressure plasma source or the low impedance cutting torches discussed above.

In step 1403, while in a no-plasma state, generating a near resonance-voltage on the secondary side due to the leakage inductance and the capacitance.

In step 1405, ignite a plasma at the near-resonance-voltage, and thereafter lower the operational frequency driving the plasma. In this step, the fully developed plasma load is resistive with the leakage inductance acting as a low pass filter preventing high frequency transients from propagating backwards into the AC source.

Furthermore, control 116 can suppress current spiking at the time of the plasma ignition by having the operational frequency $f_{op}$ offset from resonant frequency $f_1$ and by having a duty cycle of the voltage pulses being less than 50%, less than 40%, less than 30%, less than 20%, or less than 10% of a total period of the cycle. Control 116 can be programmed to identify the plasma ignition at the operational frequency $f_{op}$ by a voltage spike on a voltage drive signal to the first (primary) side of the transformer. To suppress current spiking, the voltage spike occurs when an instantaneous value of AC current to the first (primary) side of the transformer is substantially near zero.

Furthermore, control 116 can be programmed with a predetermined plasma initiation frequency $f_2$ which is offset from the resonant frequency $f_1$, and can be configured to at least one of:
a) provide repeated cycles of the drive voltage at the initiation frequency $f_2$ to provide time for the plasma ignition,
b) change the operational frequency $f_{op}$ of the AC power source by a step size that makes no more than a 10% voltage change near the initiation frequency $f_2$, and
c) change the operational frequency $f_{op}$ of the AC power source to values of frequency above or below the initiation frequency $f_2$.

It will be understood that one or more of the processes, sub-processes, and process steps described herein may be performed by hardware, firmware, software, or a combination of two or more of the foregoing, on one or more electronic or digitally-controlled devices for example adjusting the variable capacitors and/or the relative bobbin positions and/or the power level of the AC source. The software may reside in a software memory (not shown) in a suitable electronic processing component or system such as, for example, control 116 schematically depicted in FIGS. 1A and 1B. The software memory may include an ordered listing of executable instructions for implementing logical functions (that is, "logic" that may be implemented in digital form such as digital circuitry or source code, or in analog form such as an analog source such as an analog electrical, sound, or video signal). The instructions may be executed within a processing module, which includes, for example, one or more microprocessors, general purpose processors, combinations of processors, digital signal processors (DSPs), or application specific integrated circuits (ASICs). Further, the schematic diagrams describe a logical division of functions having physical (hardware and/or software)

implementations that are not limited by architecture or the physical layout of the functions. The examples of systems described herein may be implemented in a variety of configurations and operate as hardware/software components in a single hardware/software unit, or in separate hardware/software units.

The executable instructions may be implemented as a computer program product having instructions stored therein which, when executed by a processing module of an electronic system (e.g., the control 116 depicted in FIGS. 1A and 1i), direct the electronic system to carry out the instructions. The computer program product may be selectively embodied in any non-transitory computer-readable storage medium for use by or in connection with an instruction execution system, apparatus, or device, such as a electronic computer-based system, processor-containing system, or other system that may selectively fetch the instructions from the instruction execution system, apparatus, or device and execute the instructions. In the context of this disclosure, a computer-readable storage medium is any non-transitory means that may store the program for use by or in connection with the instruction execution system, apparatus, or device. The non-transitory computer-readable storage medium may selectively be, for example, an electronic, magnetic, optical, electromagnetic, infrared, or semiconductor system, apparatus, or device. A non-exhaustive list of more specific examples of non-transitory computer readable media include: an electrical connection having one or more wires (electronic); a portable computer diskette (magnetic); a random access memory (electronic); a read-only memory (electronic); an erasable programmable read only memory such as, for example, flash memory (electronic); a compact disc memory such as, for example, CD-ROM, CD-R, CD-RW (optical); and digital versatile disc memory, i.e., DVD (optical). Note that the non-transitory computer-readable storage medium may even be paper or another suitable medium upon which the program is printed, as the program can be electronically captured via, for instance, optical scanning of the paper or other medium, then compiled, interpreted, or otherwise processed in a suitable manner if necessary, and then stored in a computer memory or machine memory.

It will also be understood that the term "in signal communication" as used herein means that two or more systems, devices, components, modules, or sub-modules are capable of communicating with each other via signals that travel over some type of signal path. The signals may be communication, power, data, or energy signals, which may communicate information, power, or energy from a first system, device, component, module, or sub-module to a second system, device, component, module, or sub-module along a signal path between the first and second system, device, component, module, or sub-module. The signal paths may include physical, electrical, magnetic, electromagnetic, electrochemical, optical, wired, or wireless connections. The signal paths may also include additional systems, devices, components, modules, or sub-modules between the first and second system, device, component, module, or sub-module.

More generally, terms such as "communicate" and "in . . . communication with" (for example, a first component "communicates with" or "is in communication with" a second component) are used herein to indicate a structural, functional, mechanical, electrical, signal, optical, magnetic, electromagnetic, ionic or fluidic relationship between two or more components or elements. As such, the fact that one component is said to communicate with a second component is not intended to exclude the possibility that additional components may be present between, and/or operatively associated or engaged with, the first and second components.

Exemplary Statements of the Invention

The following numbered statements of the invention set forth a number of inventive aspects of the present invention:

Statement 1. A system for plasma ignition and maintenance of an atmospheric pressure plasma, the system comprising:
a variable frequency alternating current (AC) power source;
a transformer having
a magnetic core (optionally including gaps),
a primary winding on a first (primary) side of the magnetic core, and
a secondary winding on a second (secondary) side of the magnetic core;
a cable connected to the secondary winding to output power from the transformer, and the cable having a capacitance to ground; and
a programmed microprocessor for control of power to the atmospheric pressure plasma,
wherein
the primary winding is connectable to the power source,
the cable is connectable to electrodes of the atmospheric pressure plasma,
the secondary winding and the cable are resonant at a resonant frequency $f_1$, and
the programmed processor is configured to
a) at pre-ignition, power the AC power source at an operational frequency $f_{op}$ higher than the resonant frequency $f_r$,
b) decrease the operational frequency $f_{op}$ of the AC power source until there is plasma ignition, and
c) after the plasma ignition, further decrease the operational frequency $f_{op}$ of the AC power source to a frequency lower than the resonant frequency $f_r$.

Statement 2. The system of statement 1, wherein the programmed processor is configured to set the operational frequency $f_{op}$ to at least $1.5 \times f_1$ to mitigate against current spiking occurring in the AC power supply as a result of an arc forming at the time of the plasma ignition and presenting a short-circuit load for the transformer.

Statement 3. The system of any of the statements above, wherein the programmed processor is configured to adjust the operational frequency for, until $f_{op}$ equals the resonant frequency $f_1$, wherein a rate of frequency change is 10× slower than the BW/2 Hz per 0.6/BW seconds.

Statement 4. The system of any of the statements above, wherein the AC power source comprises a transistor bridge configured to produce voltage pulses at the operational frequency $f_{op}$ for application to the primary winding of the transformer.

Statement 5. The system of any of the statements above, wherein the programmed processor is configured to suppress current spiking at the time of the plasma ignition by having the operational frequency $f_{op}$ offset from resonant frequency $f_1$ and optionally may operate with a duty cycle of the voltage pulses being nearly 100%, less than 75%, less than 50% less, than 25%, or less than 10% of a total period of the cycle.

Statement 6. The system of statement 1, wherein the programmed microprocessor is configured to identify the plasma ignition by monitoring for a change in primary current wave-shape on the primary side of the transformer.

Statement 7. The system of statement 6, wherein a potentially damaging current spike is minimized because the plasma ignition occurs when an instantaneous value of AC current to the primary side of the transformer is substantially near zero.

Statement 8. The system of statement 1, wherein
the programmed processor is programmed with a predetermined plasma initiation frequency $f_2$ which is offset from the resonant frequency $f_1$, and
the programmed processor is configured to at least one of:
d) provide repeated cycles of the drive voltage at the initiation frequency $f_2$ to provide time for the plasma ignition,
e) change the operational frequency $f_{op}$ of the AC power source by a step size that makes no more than a 10% voltage change near the initiation frequency $f_2$, and
f) change the operational frequency $f_{op}$ of the AC power source to values of frequency above or below the initiation frequency $f_2$.

Statement 9. The system of any of the statements above, wherein the plasma ignition occurs when stored energy in the secondary side of the transformer is substantially all in the capacitance of the cable.

Statement 10. The system of any of the statements above, wherein the transformer comprises a resonant transformer having a resonance associated with the capacitance of the cable and an inductance of the transformer.

Statement 11. The system of any of the statements above, wherein the secondary winding has more turns than the primary winding such that the transformer comprises a step-up transformer for supplying current to the atmospheric pressure plasma.

Statement 12. The system of any of the statements above, wherein the transformer comprises a ballast transformer in which the primary winding comprises a first primary winding and a second primary winding.

Statement 13. The system of any of the statements above, wherein the first primary winding and the second primary winding provide an inductive impedance that opposes current surges when a load is introduced.

Statement 14. The system of any of the statements above, wherein the second primary winding is displaceable from the secondary winding to alter a coupling coefficient of the transformer.

Statement 15. The system of any of the statements above, wherein the second primary winding coaxially surrounds the secondary winding.

Statement 16. The system of any of the statements above, wherein the second primary winding is offset axially from and surrounds the secondary winding or wherein the first primary winding is offset axially from the magnetic core.

Statement 17. The system of any of the statements above, wherein the programmed processor is configured to produce a drive signal for a transistor bridge connected to the transformer.

Statement 18. The system of any of the statements above, wherein the programmed processor comprises an analogue to digital converter (ADC) in electrical communication with current and voltage sampling points.

Statement 19. The system of any of the statements above, further comprising a current sense transformer, wherein the transistor bridge is coupled to the current sense transformer, and the current sense transformer is connected in series with the primary winding of the transformer.

Statement 20. The system of any of the statements above, wherein the processor, the transistor bridge, the current sense transformer, and the analogue to digital converter (ADC) comprise a chirp plasma ignition and plasma maintenance controller for the system.

Statement 21. A (computerized) method for plasma ignition and maintenance of an atmospheric pressure plasma using any of the systems and programmed processors described in the statements above.

Statement 22. The method of statement 21, comprising setting the operational frequency $f_{op}$ to at least $1.5 \times f_1$ to mitigate against current spiking occurring in the AC power supply as a result of an arc forming at the time of the plasma ignition and presenting a short-circuit load for the transformer.

Statement 23. The method of statement 21, comprising adjusting the operational frequency for, until $f_{op}$ equals the resonant frequency $f_1$, wherein a rate of frequency adjustment is less than $0.6 \times$(a bandwidth in Hz of the resonance at $f_1$) per second to avoid or minimize current spikes after plasma ignition.

Statement 24. The method of statement 21, comprising controlling a transistor bridge so that the bridge produces voltage pulses at the operational frequency $f_{op}$ for application to the primary winding of the transformer.

Statement 25. The method of statement 21, comprising suppressing current spiking at the time of the plasma ignition by having the operational frequency $f_{op}$ offset from resonant frequency $f_1$.

Statement 26. The method of statement 21, comprising detecting the plasma ignition by a current spike on the primary side of the transformer.

Statement 27. The method of statement 21, comprising programming the processor with a predetermined plasma initiation frequency $f_2$ which is offset from the resonant frequency $f_1$, and can be configured to at least one of:
a) provide repeated cycles of the drive voltage at the initiation frequency $f_2$ to provide time for the plasma ignition,
b) change the operational frequency $f_{op}$ of the AC power source by a step size that makes no more than a 10% voltage change near the initiation frequency $f_2$, and
c) change the operational frequency $f_{op}$ of the AC power source to values of frequency above or below the initiation frequency $f_2$.

Statement 28. A ballast transformer as described above in any of the statements 11-18, where the plasma ignition and maintenance is controlled in part by the systems and programmed processors described in any of the statements above.

Numerous modifications and variations of the invention are possible in light of the above teachings. It is therefore to be understood that within the scope of the appended claims, the invention may be practiced otherwise than as specifically described herein.

The invention claimed is:
1. A system for plasma ignition and maintenance of an atmospheric pressure plasma, the system comprising:
a variable frequency alternating current (AC) power source;
a transformer having
a magnetic core,
a primary winding on a primary side of the magnetic core, and
a secondary winding on a secondary side of the magnetic core;
a cable connected to the secondary winding to output power from the transformer, and the cable having a capacitance to ground; and a programmed microprocessor for control of power to the atmospheric pressure plasma, wherein the primary winding is connectable to the AC power source, the cable is connectable to an electrode powering the atmospheric pressure plasma, the secondary winding and the cable are resonant at a resonant frequency $f_r$ when no plasma is present, and the programmed microprocessor is configured to a) at pre-ignition, power the AC power source at an operational frequency $f_{op}$ higher than the resonant frequency $f_r$, and b) decrease the operational frequency $f_{op}$ of the AC power source until there is plasma ignition.

2. The system of claim 1, wherein when no plasma load is present, a voltage and a current on the secondary side of the transformer are out of phase from each other, and the voltage on the secondary side of the transformer peaks when a magnitude of the current in the secondary side of the transformer is substantially near zero.

3. The system of claim 1, wherein, at the pre-ignition, the programmed microprocessor is configured to set the frequency $f_{op}$ to at least 1.5×$f_r$.

4. The system of claim 1, wherein, after plasma ignition, the programmed microprocessor is configured to adjust the operational frequency for, wherein a rate of frequency change is 10× slower than the BW/2 Hz per 0.6/BW seconds.

5. The system of claim 1, wherein the programmed microprocessor is configured to identify the plasma ignition by monitoring for a change in primary current wave-shape on the primary side of the transformer.

6. The system of claim 5, wherein a potentially damaging current spike is minimized because the plasma ignition occurs when an instantaneous value of AC current to the primary side of the transformer is substantially near zero.

7. The system of claim 1, wherein the programmed processor is configured to at least one of:

d) provide repeated cycles of drive voltage at a plasma initiation frequency to provide time for the plasma ignition, and e) change the operational frequency $f_{op}$ of the AC power source by a step size that makes no more than a 10% voltage change per step near the plasma initiation frequency.

8. The system of claim 1, wherein the plasma ignition occurs when stored energy in the secondary side of the transformer is substantially all in the capacitance of the cable.

9. The system of claim 8, wherein the transformer comprises a resonant transformer having a resonance associated with the capacitance of the cable and a leakage inductance of the transformer.

10. The system of claim 1, wherein the secondary winding has more turns than the primary winding such that the transformer comprises a step-up transformer.

11. The system of claim 1, wherein the transformer comprises an asymmetric ballast transformer in which the primary winding comprises a first primary winding and a second primary winding.

12. The system of claim 11, wherein a leakage inductance of the asymmetric ballast transformer opposes current surges at plasma ignition.

13. The system of claim 11, wherein the second primary winding is displaceable from the secondary winding to alter a coupling coefficient of the transformer.

14. The system of claim 11, wherein the second primary winding wraps around the secondary winding.

15. The system of claim 11, wherein the second primary winding is offset axially from and surrounds the secondary winding.

16. The system of claim 11, wherein the first primary winding is offset axially from the magnetic core.

17. The system of claim 1, wherein the programmed microprocessor is configured to produce a drive signal for a transistor bridge connected to the transformer.

18. The system of claim 17, wherein the programmed microprocessor comprises an analogue to digital converter (ADC) in electrical communication with current and voltage sampling points around the transformer.

19. The system of claim 18, further comprising a current sense transformer connected to the primary winding of the transformer.

20. The system of claim 19, wherein the processor, the transistor bridge, the current sense transformer, and the analogue to digital converter (ADC) comprise a chirp plasma ignition and plasma maintenance controller for the system.

* * * * *